(12) United States Patent  
Schroeder

(10) Patent No.: US 6,201,466 B1  
(45) Date of Patent: Mar. 13, 2001

(54) MAGNETORESISTOR ARRAY

(75) Inventor: Thaddeus Schroeder, Rochester Hills, MI (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/538,057

(22) Filed: Mar. 29, 2000

(51) Int. Cl.[7] .................................................. H01L 43/00
(52) U.S. Cl. ........................................ 338/32 R; 360/113
(58) Field of Search ........................ 338/32 R; 324/247, 324/252, 207.21; 360/113

(56) References Cited

U.S. PATENT DOCUMENTS

| | | | |
|---|---|---|---|
| 3,335,384 | * 8/1967 | Weiss | 338/68 |
| 4,142,218 | * 2/1979 | Gorter | 360/113 |
| 4,503,394 | * 3/1985 | Kawakami et al. | 324/252 |
| 4,835,467 | 5/1989 | Gokhale | 324/166 |
| 5,049,809 | * 9/1991 | Wakatsuki et al. | 324/117 R |
| 5,153,557 | 10/1992 | Partin et al. | 338/32 R |
| 5,184,106 | 2/1993 | Partin et al. | 338/32 R |
| 5,247,278 | * 9/1993 | Pant et al. | 338/32 R |
| 5,351,028 | * 9/1994 | Krahn | 338/32 R |
| 5,491,461 | 2/1996 | Partin et al. | 338/32 R |
| 5,602,471 | * 2/1997 | Muth et al. | 324/207.21 |
| 5,719,494 | * 2/1998 | Dettmann et al. | 324/252 |
| 5,731,702 | 3/1998 | Schroeder et al. | 324/207.21 |
| 5,754,042 | 5/1998 | Schroeder et al. | 324/207.25 |
| 5,909,115 | * 6/1999 | Kano et al. | 324/207.21 |
| 6,011,390 | * 1/2000 | Loreit et al. | 324/207.21 |
| 6,100,682 | 8/2000 | Schroeder | 324/207.21 |

FOREIGN PATENT DOCUMENTS 61-290784 * 12/1986 (JP) .................................... 338/32 R

* cited by examiner

*Primary Examiner*—Karl D. Easthom  
(74) *Attorney, Agent, or Firm*—Margaret A. Dobrowitsky

(57) ABSTRACT

A compact and inexpensive MR array of rows of MR elements on a single die, each MR element being composed of a number of serially connected MR segments. The MR elements are arranged and configured so as to produce a variety of MR array geometries suitable for specialized sensing schemes, wherein an MR array is defined as having three or more MR elements. According to a first aspect, a magnetoresistive die having a uniform MR array is provided, wherein the MR elements and MR segments thereof are mutually uniform. According to a second aspect, a magnetoresistive die of at least one nonuniform MR array is provided, wherein at least one of following is nonuniform across the MR array: a) the MR segment resistance and/or magnetic sensitivity, b) the MR element spacing, c) the MR element lengths, d) the MR element orientations, e) combinations thereof, and f) multiple arrays of combinations thereof. An MR array according to the first and second aspects of the present invention are capable of detecting two-dimensional movement of a magnetic target in relation to the MR array.

17 Claims, 3 Drawing Sheets

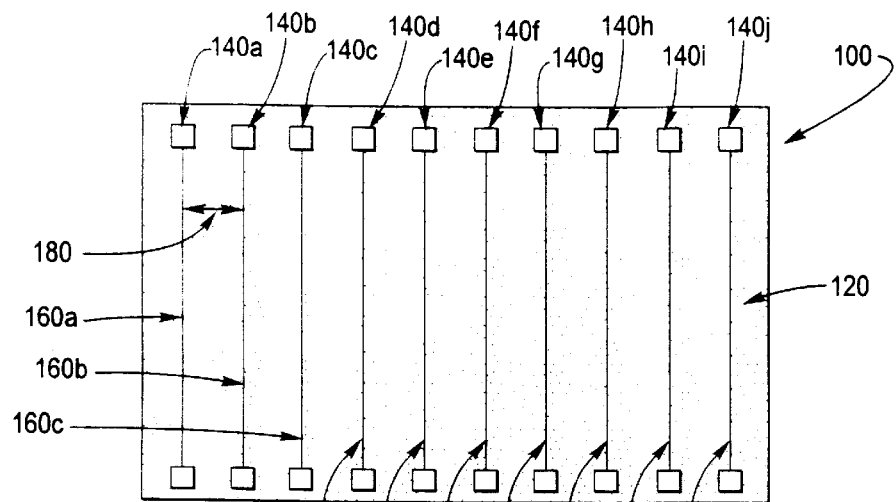
*Fig. 2A*
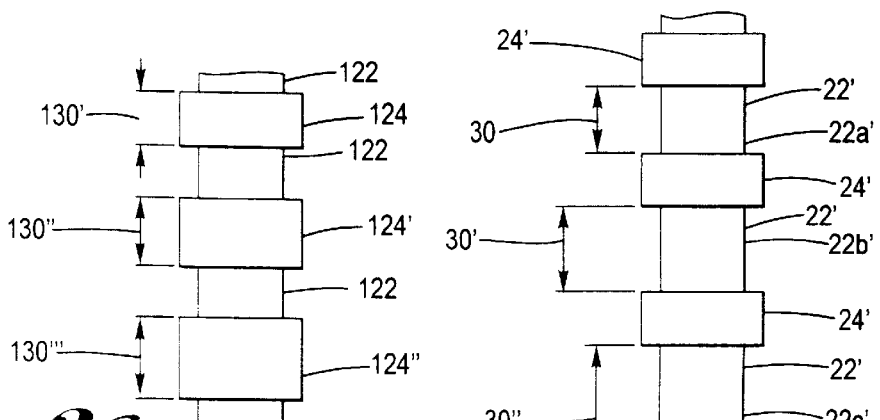
*Fig. 2C*
*Fig. 2B*
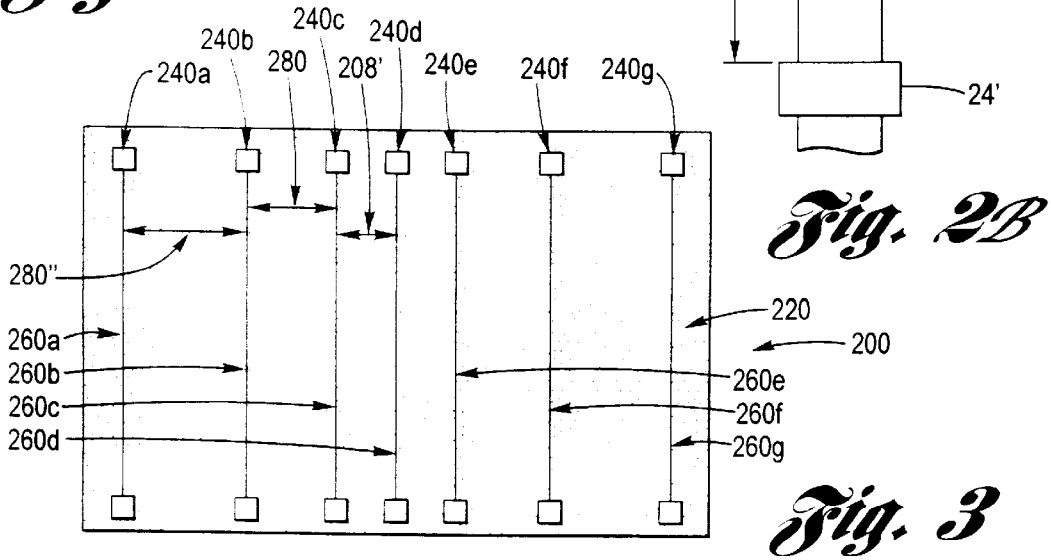
*Fig. 3*

MAGNETORESISTOR ARRAY

BACKGROUND OF THE INVENTION

The use of magnetoresistors (MRs) and Hall devices as position sensors is well known in the art. For example, a magnetically biased differential MR sensor may be used to sense angular position of a rotating toothed wheel, as for example exemplified by U.S. Pat. Nos. 4,835,467, 5,731,702, and 5,754,042.

Single element magnetic field sensors composed of, for example, an indium antimonide or indium arsenide epitaxial film strip supported on, for example, a monocrystalline elemental semiconductor substrate, are also known. The indium antimonide or indium arsenide film is, for example, either directly on the elemental semiconductor substrate or on an intermediate film that has a higher resistivity than that of silicon. A conductive contact is located at either end of the epitaxial film, and a plurality of metallic (gold) shorting bars are on, and regularly spaced along, the epitaxial film. Examples thereof are exemplified by U.S. Pat. Nos. 5,153,557, 5,184,106 and 5,491,461.

Many kinds of measurements cannot be performed with common magnetic sensors comprising a single or dual sensing element. The most common magnetic sensing element, the Hall sensor, does not quite fit the requirements for an array. Being a 4-terminal device complicates immensely the array connections. Furthermore, its low output signal would mandate the use of an integrated amplifier for each sensing element increasing the die size and its cost. However, compound semiconductor MRs, such as those manufactured from InSb, InAs, etc are simply two-terminal resistors with a high magnetic sensitivity and thus, are very suitable for the construction of single die MR arrays (in most cases one terminal of all the MR elements can be common).

Ultimately, such MR arrays could be integrated on the same die with appropriate processing circuitry. For example, if the MR array was fabricated on a Si substrate then the processing circuitry would be also Si based. For higher operating temperatures, silicon-on-insulator (SOI) could be used. A potentially lower cost alternative to the SOI approach would be to take advantage of the fact that MRs are currently fabricated on GaAs, a high temperature semiconductor, and thus, to fabricate the integrated processing circuitry from GaAs (or related InP) using HBT (Heterojunction Bipolar Transistor) or HEMT (High Electron Mobility Transistor) structures. This technology is now easily available and inexpensive through the explosive growth of the cellular phone industry.

Accordingly, what remains needed is a compact and inexpensive die having at lest one array of magnetic sensing elements and configured so as to produce a variety of array geometries suitable for specialized sensing schemes wherein an array is defined as having three or more rows of MR elements.

SUMMARY OF THE INVENTION

The present invention is a compact and inexpensive single die having at least one MR array, wherein each MR element is composed of a number of serially connected MR segments. The MR elements are arranged and configured so as to produce a variety of MR array geometries suitable for specialized sensing schemes, wherein an MR array is defined as having three or more MR elements.

According to a first aspect of the present invention, an MR array is formed of a plurality of uniformly arranged rows of MR elements, wherein each MR element is composed of a plurality of uniformly arranged, serially connected MR segments. The uniform arrangement is such as to provide a uniform MR array.

Accordingly to a second aspect of the present invention, an MR array is formed of a plurality of selectively arranged rows of MR elements, wherein each MR element is composed of a plurality of selectively varying, serially connected MR segments. The selective arrangement and/or selective variation is such as to provide a nonuniform MR array.

According to a preferred method of fabrication, an indium antimonide epitaxial film is formed, then masked and etched to thereby provide epitaxial mesas characterizing the MR elements. Shorting bars, preferably of gold, are thereupon deposited, wherein the epitaxial mesa not covered by the shorting bars provides the MR segments. The techniques for fabricating epitaxial mesas with shorting bars are elaborated in U.S. Pat. No. 5,153,557, issued Oct. 6, 1992, U.S. Pat. No. 5,184,106, issued Feb. 2, 1993 and U.S. Pat. No. 5,491,461, issued Feb. 13, 1996, each of which being hereby incorporated herein by reference.

Accordingly, it is an object of the present invention to provide an MR die comprising at least one MR array according to the first and second aspects of the present invention which is capable of detecting two-dimensional movement of a magnetic target in relation to the MR array, wherein MR arrays according to the second aspect of the present invention are capable of high resolution detection of movement along an axis generally parallel to the MR elements, as well as along the axis orthogonal thereto.

This and additional objects, features and advantages of the present invention will become clearer from the following specification of a preferred embodiment.

BRIEF DESCRIPTION OF THE DRAWINGS

FIG. 2A is a schematic representation of a single die first nonuniform MR array according to a second aspect of the present invention.

FIG. 2B is a detail view of a first example of an MR element according to the first nonuniform MR array of FIG. 2A.

FIG. 2C is a detail view of a second example of an MR element according to the first nonuniform MR array of FIG. 2A.

FIG. 3 is a schematic representation of a single die second nonuniform MR array according to the second aspect of the present invention.

DETAILED DESCRIPTION OF THE PREFERRED EMBODIMENT

Figure 1A:
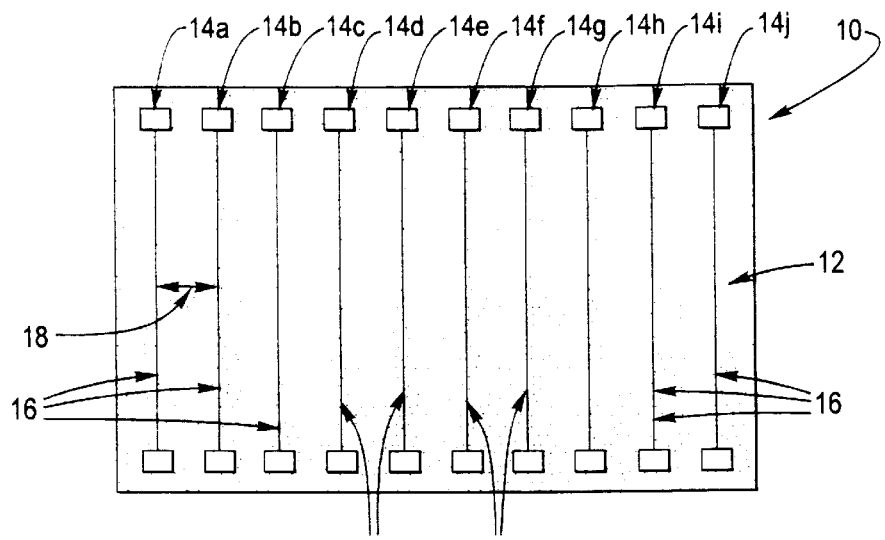
FIG. 1A is a schematic representation of a single die uniform MR array according to a first aspect of the present invention.

FIG. 1A is a schematic representation of an MR die 10 on which a uniform MR array 12 according to a first aspect of the present invention is depicted. The uniform MR array 12 consists of a multitude of rows 14a through 14j of identical MR elements 16, wherein each MR element is matched to the other MR elements in terms of resistance and magnetic sensitivity with equal spacing 18 between the rows so as to provide a uniform linear MR array.

Figure 1B:
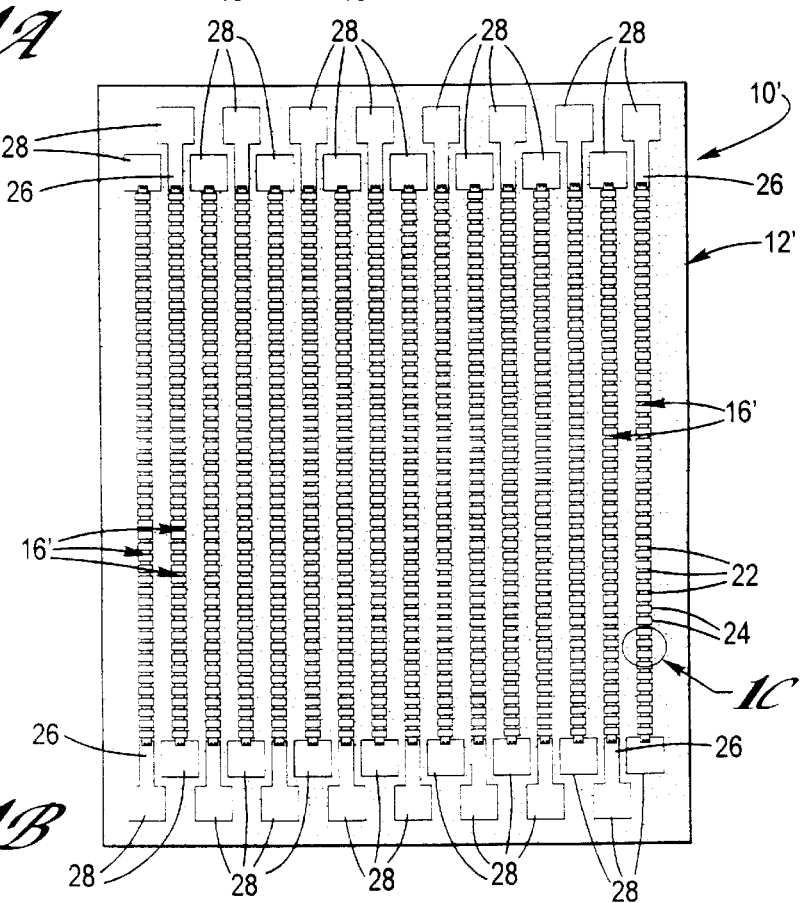
FIG. 1B is a detailed depiction of a single die uniform MR array according to the first aspect of the present invention.
Figure 1C:
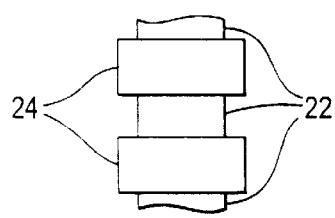
FIG. 1C is a detail view of an MR element, seen at circle 1C of FIG. 1B.

FIGS. 1B and 1C show details of an MR die 10' having a uniform MR array 12' according to the first aspect of the present invention. Structurally, the MR die 10' consists of a plurality of MR elements 16' wherein each MR element is uniformly matched to the other MR elements in terms of resistance and magnetic sensitivity. Further, each MR element 16' is composed of a number of MR segments 22 demarcated by uniform shorting bars 24 which are preferably gold. The MR segments 22 are each uniformly matched to the others (that is, the MR segments are identical).

By way of preferred example, each MR segment 16' is composed of indium antimonide (InSb) epitaxial film mesas. Each epitaxial film mesa is provided, by way of preferred example, by forming an indium antimonide epitaxial film, then masking and etching it. The shorting bars 24, which demarcate the MR elements 22, are composed of gold bars deposited upon the MR segments. Leads 26, preferably also of gold, are provided, in this example, for every other MR segment to its respective bonding pads (or terminals) 28.

FIG. 2A is a schematic representation of an MR die 100 on which a nonuniform MR array 120 according to a second aspect of the present invention is depicted. The nonuniform MR array 120 consists of a multitude of rows 140a through 140j of MR elements 160a through 160j, each having an equal length 182 and an equal spacing 180 therebetween. The MR elements 22', 122 (see FIGS. 2B and 2C), each have a resistance and/or magnetic sensitivity which varies in relation to that of the others as a predetermined nonuniform pattern so as to produce a weighted linear MR array.

The aforesaid variation in magnetic sensitivity and/or resistance of the MR elements is provided by selection of the MR segments of the respective MR elements. For example, as shown at FIG. 2B, the shorting bars 24' may be themselves uniform, but are placed at differing spacings 30, 30', 30'' along an epitaxial mesa so as to provide MR segments 22a', 22b' and 22c' of differing lengths. For another example, shown at FIG. 2C, the shorting bars 124, 124', 124'' may be uniformly spaced to provide uniform MR segments 122, but the shorting bars have, respectively, non uniform lengths 130', 130'', 130'''. This nonuniformity at each MR element provides a predetermined nonuniformity of the MR array 120'.

The nonuniform MR array 120 is generally fabricated according to the method previously described for the uniform MR array 12' of FIG. 1B, including the respective conductive contact at each opposing end of each MR element.

FIG. 3 is a schematic representation of an MR die 200 on which a second nonuniform MR array 220 according to the second aspect of the present invention is depicted. The second nonuniform MR array 220 consists of a multitude of rows 240a through 240g of MR elements 260a through 260g, each having an equal length 282, but now there is an unequal spacing 280, 280', 280'' between adjacent rows of MR elements. The resistance and/or magnetic sensitivity of each MR element 260a through 260g may be matched to the other MR segments, or may vary (be nonuniform) according to a predetermined pattern, for example as per the is description of the nonuniform MR array 120. The nonuniform MR array 220 is generally fabricated according to the method previously described for the uniform MR array 12' of FIG. 1B, including the respective conductive contact at each opposing end of each MR element.

Figure 4:
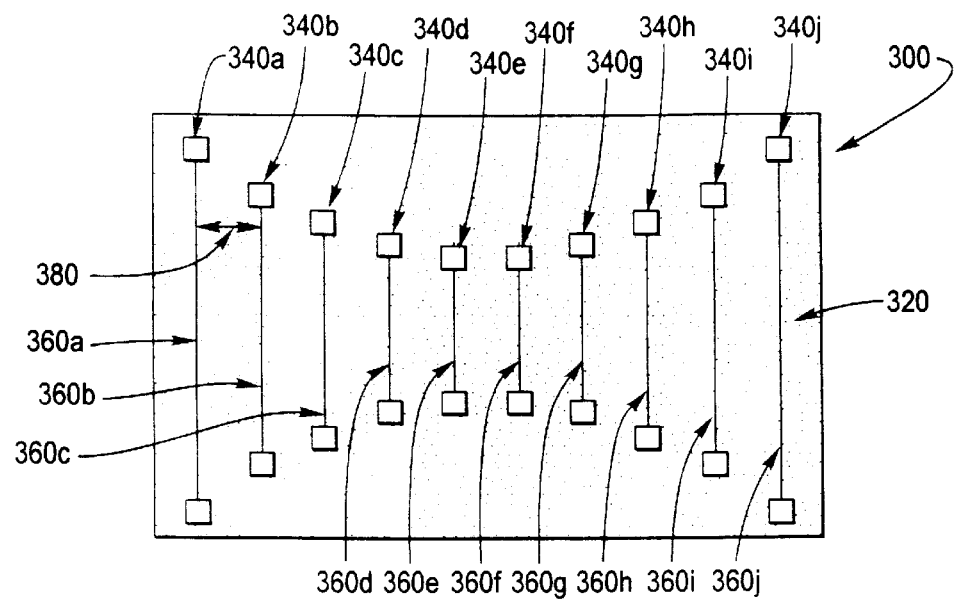
FIG. 4 is a schematic representation of a single die third nonuniform MR array according to the present invention.

FIG. 4 is a schematic representation of an MR die 300 on which a third nonuniform MR array 320 according to the second aspect of the present invention is depicted. The third nonuniform MR array 320 consists of a multitude of rows 340a through 340j of MR elements 360a through 360j of varying lengths 382 with equal spacing 380 between adjacent rows. The resistance and/or magnetic sensitivity of each MR element 360a through 360j may be matched to the other MR elements or may vary (be nonuniform) according to a predetermined pattern, as for example per the description of the first nonuniform MR array 120. Further, the spacing 380 between adjacent MR segments 360a through 360j may vary (be nonuniform) according to a predetermined pattern, as for example per the description for the second nonuniform MR array 220.

The third nonuniform MR array 320 is generally fabricated according to the method previously described for the uniform MR array 12' of FIG. 1B, including the respective conductive contact at each opposing end of each MR element.

Figure 5:
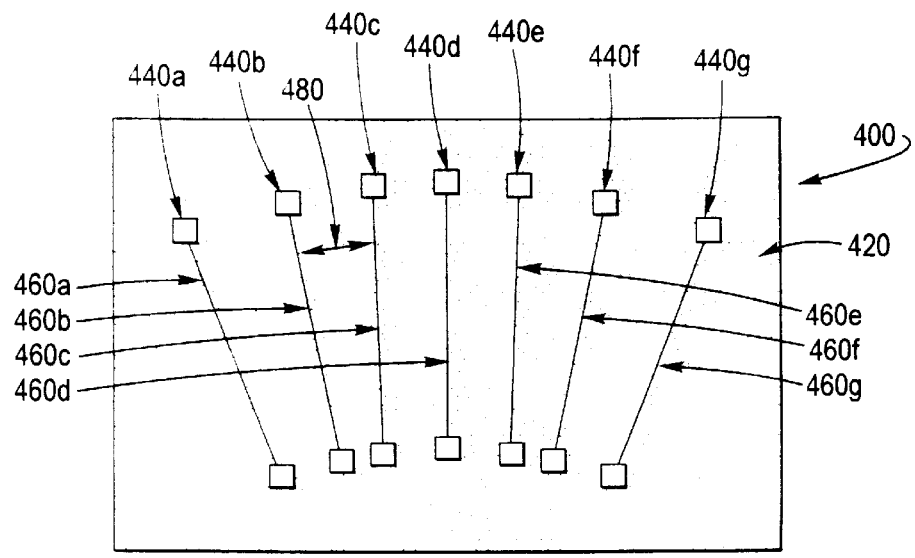
FIG. 5 is a schematic representation of a fourth example of a single die fourth nonuniform MR array according to the present invention.

FIG. 5 is a schematic representation of an MR die 400 on which a fourth nonuniform MR array 420 according to the second aspect of the present invention is depicted. The fourth nonuniform MR array 220 consists of a multitude of rows 440a through 440g of MR elements 460a through 460g of lengths 482 more or less arranged as radii of an arc. The resistance and/or magnetic sensitivity of each MR element 460a through 460g may be matched to the other MR elements or may vary (be nonuniform) according to a predetermined pattern, as for example per the description of the first nonuniform MR array 120. The spacing 480 between adjacent MR elements 460a through 460g may be arcuately varying or may vary (be nonuniform) according to a any other predetermined nonparallel pattern. The lengths 482 of the MR elements may also vary (be nonuniform) according to a predetermined pattern, as for example per the description of the third nonuniform MR array 320. The opposing ends of the MR segments (whereat the contacts are located) may be arcuately arranged according to a predetermined pattern, as for example circular or elliptical, or arranged according to another geometry.

The fourth nonuniform MR array 420 is generally fabricated according to the method previously described for the uniform MR array 12' of FIG. 1B, including the respective conductive contact at each opposing end of each MR element.

It is to be understood from the foregoing exposition that any of the nonuniform MR arrays 120, 220, 320, 420 may be combined, to provide a hybrid nonuniform MR array. Thus, for example, a nonuniform MR array may include: the MR segments having mutually nonuniform magnetic sensitivities and/or resistances, the lengths of the MR elements being mutually nonuniform, the MR elements being mutually nonuniformly oriented, the spacing between MR segments being nonuniform, combinations thereof, and multiple MR arrays of combinations thereof.

To those skilled in the art to which this invention appertains, the above described preferred embodiment may be subject to change or modification. Such change or modification can be carried out without departing from the scope of the invention, which is intended to be limited only by the scope of the appended claims.

What is claimed is:

1. A magnetoresistive die, comprising:

a plurality of rows of magnetoresistive elements, each magnetoresistive element having a first end terminating at a respective first terminal and an opposite second end terminating at a respective second terminal, each magnetoresistive element comprising an epitaxial mesa having a plurality of serially connected magnetoresistive segments demarcated by shorting bars, wherein each magnetoresistive segment is uniformly matched to each other magnetoresistive segment;

wherein the plurality of rows of magnetoresistive elements are arranged to thereby provide a uniform array.

2. A magnetoresistive die, comprising:

a plurality of rows of magnetoresistive elements, each magnetoresistive element having a first end terminating at a respective first terminal and an opposite second end terminating at a respective second terminal, each magnetoresistive element comprising an epitaxial mesa having a plurality of serially connected magnetoresistive segments demarcated by shorting bars;

wherein at least one of either said magnetoresistive elements and said magnetoresistive segments is nonuniformly arranged to thereby provide a nonuniform array.

3. The magnetoresistive die of claim 2, wherein said nonuniform array comprises the plurality of magnetoresistive elements having at least one of: mutually nonuniform magnetic sensitivities and mutually nonuniform resistances, wherein the plurality of magnetoresistive segments of at least one of the magnetoresistive elements vary in a predetermined pattern in terms of at least one of magnetic sensitivity and resistance.

4. The magnetoresistive die of claim 3, wherein said nonuniform array comprises the plurality of magnetoresistive elements having nonuniform lengths between said first and second ends, respectively.

5. The magnetoresistive die of claim 3, wherein said nonuniform array comprises the plurality of magnetoresistive elements having mutually nonparallel orientations.

6. The magnetoresistive die of claim 3, wherein said nonuniform array comprises the plurality of magnetoresistive elements having mutually nonuniform spacing therebetween.

7. The magnetoresistive die of claim 4, wherein said nonuniform array comprises the plurality of magnetoresistive elements having nonuniform spacing therebetween.

8. The magnetoresistive die of claim 4, wherein said nonuniform array comprises the plurality of magnetoresistive elements having mutually nonparallel orientations.

9. The magnetoresistive die of claim 7, wherein said nonuniform array comprises the plurality of magnetoresistive elements having mutually nonparallel orientations.

10. The magnetoresistive die of claim 2, wherein said nonuniform array comprises the plurality of magnetoresistive elements having nonuniform lengths between said first and second ends, respectively.

11. The magnetoresistive die of claim 10, wherein said nonuniform array comprises the plurality of magnetoresistive elements having mutually nonuniform spacing therebetween.

12. The magnetoresistive die of claim 10, wherein said nonuniform array comprises the plurality of magnetoresistive elements having mutually nonparallel orientations.

13. The magnetoresistive die of claim 11, wherein said nonuniform array comprises the plurality of magnetoresistive elements having mutually nonparallel orientations.

14. The magnetoresistive die of claim 2, wherein said nonuniform array comprises the plurality of magnetoresistive elements having mutually nonuniform spacing therebetween.

15. The magnetoresistive die of claim 14, wherein said nonuniform array comprises the plurality of magnetoresistive elements having mutually nonparallel orientations.

16. The magnetoresistive die of claim 2, wherein said nonuniform array comprises the plurality of magnetoresistive elements having mutually nonparallel orientations.

17. A magnetoresistive die, comprising:

at least one nonuniform array comprising a plurality of rows of magnetoresistive elements, each magnetoresistive element having a first end terminating at a respective first terminal and an opposite second end terminating at a respective second terminal, each magnetoresistive element comprising an epitaxial mesa having a plurality of serially connected magnetoresistive segments demarcated by shorting bars;

wherein said at least one nonuniform array comprises at least one of: a) the plurality of magnetoresistive elements having at least one of mutually nonuniform magnetic sensitivities and mutually nonuniform resistances, wherein the plurality of magnetoresistive segments of at least one of the magnetoresistive elements vary in a predetermined pattern in terms of at least one of magnetic sensitivity and resistance; b) the plurality of magnetoresistive elements having nonuniform lengths between said first and second ends, respectively; c) the plurality of magnetoresistive elements having mutually nonparallel orientations; d) the plurality of magnetoresistive elements having mutually nonuniform spacing therebetween; and e) combinations thereof.

* * * * *